United States Patent
Chan et al.

(10) Patent No.: US 9,263,288 B2
(45) Date of Patent: Feb. 16, 2016

(54) ETCHING METHOD USING BLOCK-COPOLYMERS

(71) Applicants: IMEC, Leuven (BE); Tokyo Electron Limited, Tokyo (JP)

(72) Inventors: Boon Teik Chan, Penang (MY); Shigeru Tahara, Yamanashi (JP)

(73) Assignees: IMEC, Leuven (BE); Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/074,460

(22) Filed: Nov. 7, 2013

(65) Prior Publication Data

US 2014/0131839 A1 May 15, 2014

Related U.S. Application Data

(60) Provisional application No. 61/726,390, filed on Nov. 14, 2012.

(51) Int. Cl.

| | |
|---|---|
| *H01L 21/308* | (2006.01) |
| *H01L 21/3065* | (2006.01) |
| *H01L 27/04* | (2006.01) |
| *H01L 51/00* | (2006.01) |
| *H01L 21/027* | (2006.01) |
| *G03F 7/00* | (2006.01) |
| *B82Y 10/00* | (2011.01) |
| *B82Y 40/00* | (2011.01) |

(52) U.S. Cl.
CPC ............ *H01L 21/3086* (2013.01); *B82Y 10/00* (2013.01); *B82Y 40/00* (2013.01);
(Continued)

(58) Field of Classification Search
CPC ............ H01L 21/027; H01L 21/0271; H01L 21/31058; H01L 21/31127; H01L 21/31133; H01L 21/31138; H01L 21/312; H01L 51/0001; H01L 51/0014; H01L 51/0017; H01L 51/0018; H01L 51/0019; H01L 21/3081; H01L 21/3086; H01L 21/3088
USPC ................. 438/82, 99, 689, 690, 710; 257/40, 257/E51.001, E51.036, E21.218, E21.254
See application file for complete search history.

(56) References Cited

U.S. PATENT DOCUMENTS

| | | | |
|---|---|---|---|
| 8,530,913 B2 * | 9/2013 | Nishikawa et al. | 257/95 |
| 2002/0197747 A1 * | 12/2002 | Nakagawa et al. | 438/9 |

(Continued)

FOREIGN PATENT DOCUMENTS

WO 2010/096363 A2 8/2010

OTHER PUBLICATIONS

Yamashita, Fumiko et al., "Exploration of Suitable Dry Etch Technologies for Directed Self-Assembly", Proc. SPIE 8328, Advanced Etch Technology for Nanopatterning, Mar. 29, 2012, 9 pages.

(Continued)

*Primary Examiner* — Eduardo A Rodela
(74) *Attorney, Agent, or Firm* — McDonnell Boehnen Hulbert & Berghoff LLP

(57) ABSTRACT

A method for lithography is disclosed. The method includes obtaining a self-organizing block-copolymer layer on a neutral layer overlying a substrate, the self-organizing block-copolymer layer comprising at least two polymer components having mutually different etching resistances, the self-organizing block-copolymer layer furthermore comprising a copolymer pattern structure formed by micro-phase separation of the at least two polymer components. Further, the method includes etching selectively a first polymer component of the self-organizing block-copolymer layer, thereby remaining a second polymer component. Still further, the method includes applying a plasma etching to the neutral layer using the second polymer component as a mask, wherein the plasma etching comprises an inert gas and $H_2$.

17 Claims, 2 Drawing Sheets

(52) U.S. Cl.
CPC ......... *G03F 7/0002* (2013.01); *H01L 21/0271* (2013.01); *H01L 21/3065* (2013.01); *H01L 21/3081* (2013.01); *H01L 21/3088* (2013.01); *H01L 27/04* (2013.01); *H01L 51/0014* (2013.01); *H01L 51/0017* (2013.01)

(56) References Cited

U.S. PATENT DOCUMENTS

| | | | |
|---|---|---|---|
| 2004/0015022 A1* | 1/2004 | Ohno et al. | 570/164 |
| 2006/0113182 A1* | 6/2006 | Park et al. | 204/192.12 |
| 2006/0258159 A1* | 11/2006 | Colburn et al. | 438/694 |
| 2007/0281220 A1* | 12/2007 | Sandhu et al. | 430/5 |
| 2009/0179001 A1* | 7/2009 | Cheng et al. | 216/41 |
| 2011/0147985 A1* | 6/2011 | Cheng et al. | 264/225 |
| 2012/0041121 A1 | 2/2012 | Asakawa et al. | |
| 2014/0193754 A1* | 7/2014 | Wu et al. | 430/296 |
| 2015/0034594 A1* | 2/2015 | Singh et al. | 216/49 |

OTHER PUBLICATIONS

Ting, Yuk-Hong et al., "Surface Roughening of Polystyrene and Poly(methyl methacrylate) in Ar/O2 Plasma Etching", Polymers, vol. 2, 2010, pp. 649-663.

Somervell, Mark et al., "Comparison of Directed Self-Assembly Integrations", Advances in Resist Materials and Processing Technology XXIX, Proc. SPIE vol. 8325, Feb. 12, 2012, pp. 1-14.

* cited by examiner

ETCHING METHOD USING BLOCK-COPOLYMERS

CROSS-REFERENCE TO RELATED APPLICATIONS

This application claims priority under 35 U.S.C. §119(e) to U.S. Provisional Patent Application Ser. No. 61/726,390, filed on Nov. 14, 2012, and entitled "Method for Etching of Polymer Structures", the full disclosure of which is incorporated herein by reference.

FIELD OF THE DISCLOSURE

The disclosure relates to the field of lithography and in particular to the field of nanolithography, e.g. nanolithography for the production of semiconductor integrated circuits or nanoelectromechanical systems. More specifically it relates to a method for etching polymer structures (and optionally the substrate) underlying self-assembled block-copolymer materials.

BACKGROUND OF THE DISCLOSURE

In semiconductor manufacture, a need exists to achieve higher component densities and smaller, e.g. nanoscale, structures in integrated circuits and nanoelectromechanical systems. The lithography techniques to produce semiconductor devices typically involve applying patterns of the device structure onto a resist layer, and selectively etching away the substrate exposed by the pattern in the resist layer. In further processing steps, other materials may be deposited in the etched areas to form, for example, an integrated circuit.

In conventional photolithography a pattern mask is projected by light onto a photo-sensitive polymer resist. However, the resolution of this approach is inherently limited by diffraction. Alternatively, a pattern may also be transferred to a suitable resist layer by energy waves of a different radiative quality, such as in electron beam lithography, ion beam lithography or x-ray lithography. However, with such lithography methods, producing nano-scale structures at an acceptable cost and industrially acceptable throughput remains difficult.

Directed self-assembly (DSA) of block-copolymers is an emergent alternative approach to nanolithography. Block-copolymers consist of chemically different polymer blocks interconnected by covalent bonds. The chemically different polymer blocks undergo a microphase separation, which is driven by repulsion between the dissimilar polymer chains, such that homogenous domains in a periodic nanostructure are formed after annealing. For example, such periodic structures may comprise hexagonally packed cylinders, spheres, gyroid structures or lamellae. The type of structure which is formed is furthermore controllable by tuning the ratios of the different polymer block lengths. However, the block-copolymer material may feature random orientation and a poor long-range order when not constrained by orientation control techniques. Such techniques, for example graphoepitaxy or chemical epitaxy, selectively direct the formation of domains in the block-copolymer material. Through subsequent selective removal of one polymer type, a patterned structure of gaps is formed which can be used as a resist layer on the underlying substrate, thus enabling feature patterning on scales in the range of 5 nanometers (nm) to 50 nm.

In DSA, a pre-pattern may be applied on the substrate to direct the orientation of the block-copolymer material when applied thereon. This pre-pattern may be used to achieve frequency multiplication, e.g. generating cross-bar structures or line patterns of higher spatial frequency than the pre-pattern, thus increasing the pitch of the final printed structure. Therefore, advanced scale-down patterning may be achieved by DSA with pattern features smaller than 14 nm. Moreover, DSA can be used to repair defects and improve uniformity in the original print, e.g. by shrinking and rectifying the pre-pattern. For example, in combination with EUV lithography, limitations imposed by local variations in the critical dimension (CD) may be overcome, which may be, for example, advantageous for manufacturing small contact features.

Although solutions usually exist for the selective removal of one polymer type, the use of the remaining patterned structure as a resist layer for patterning the underlying layers (and optionally patterning the substrate) remains a challenge. Typically, etching methods allowing etching trough the underlying layers (and optionally etching of the substrate), also damage the remaining polymer type, thereby producing a distorted pattern in the underlying layers (and optionally the substrate). There is therefore a need in the art for new etching methods overcoming this limitation.

SUMMARY OF THE DISCLOSURE

Example embodiments of the present disclosure provide good dry etching of the layers underlying the self-assembled block-copolymer material (and optionally etching of the substrate).

It is an advantage of embodiments of the present disclosure that etching and therefore damage to the remaining polymer type can be limited.

It is an advantage of embodiments of the present disclosure that the pattern composed of the remaining polymer type can serve as a mask for transferring this pattern with low distortion to underlying layers and optionally the substrate In a first aspect, the present disclosure relates to a method for block-copolymer lithography. An example method includes obtaining a self-organizing block-copolymer layer on a neutral layer, the neutral layer overlying a substrate, the self-organizing block-copolymer layer comprising at least two polymer components having mutually different etching resistances, the self-organizing block-copolymer layer furthermore comprising a copolymer pattern structure formed by micro-phase separation of the at least two polymer components. Further, the method includes etching selectively a first polymer component of the self-organizing block-copolymer layer, thereby remaining a second polymer component. Still further, the method includes applying a plasma etching to the neutral layer using the second polymer component as a mask, wherein the plasma etching comprises an inert gas and $H_2$.

In a second aspect, the present disclosure relates to a partially fabricated integrated circuit. An example partially fabricated integrated circuit includes: a polymer pattern structure provided on a neutral layer, the neutral layer overlaying a substrate, said polymer pattern structure being a block-copolymer layer wherein at least one polymer component has been etched away. Said polymer pattern may have a half pitch of less than 50 nm, advantageously less than 20 nm, more advantageously less than 16 nm, the neutral layer having a pattern obtainable by etching the neutral layer using the polymer pattern as a mask in such a way as to expose the substrate underneath.

These as well as other aspects, advantages, and alternatives, will become apparent to those of ordinary skill in the art by reading the following detailed description, with reference where appropriate to the accompanying drawings.

BRIEF DESCRIPTION OF THE DRAWINGS

Various exemplary embodiments are described herein with reference to the following drawings, wherein like numerals denote like entities.

Figure 1:
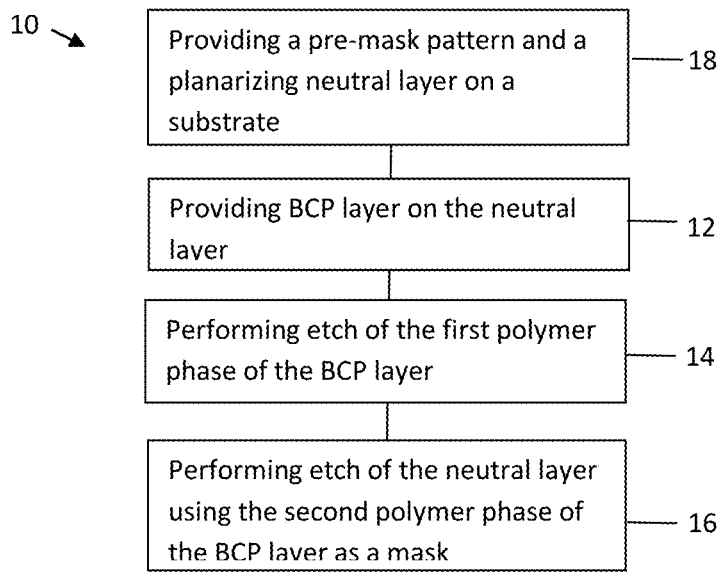
FIG. 1 is a flow chart showing an example method according to embodiments of the present disclosure.

The drawings are only schematic and are non-limiting. In the drawings, the size of some of the elements may be exaggerated and not drawn on scale for illustrative purposes.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Where in embodiments of the present disclosure reference is made to a "block-copolymer", reference is made to a polymer having two or more chemically different polymer blocks, for example a di-block, tri-block, star, comb or other polymer with controlled structure. The blocks may typically have different chemical properties, such as the degree of hydrophilicity or hydrophobicity. The blocks may typically be mutually immiscible, or only partially miscible, over a range of temperatures, e.g. to allow formation of separate micro-phase domains, thus enabling self-assembly. Self-assembly may be based on chemical differences between the different polymer blocks, e.g. a hydrophilicity/hydrophobicity imbalance. Such block-copolymers may be obtained by methods known in the art or later developed, for example by atom transfer radical polymerization, reversible addition fragmentation chain transfer polymerization, nitroxide-mediated polymerization, boron-mediated polymerization or catalytic chain transfer polymerization.

Where in embodiments of the present disclosure reference is made to "annealing", reference is made to a process that allows self-assembly of structures by micro-phase separation in a block-copolymer material.

Where in embodiments of the present disclosure reference is made to "block-copolymer lithography", reference is made to a lithographic method making use of a mask obtained from the selective etching of a polymer component within a block-copolymer.

The present disclosure relates to a method for block-copolymer lithography, the method comprising:

obtaining a self-organizing block-copolymer layer on a neutral layer, the neutral layer overlying a substrate, the self-organizing block-copolymer layer comprising at least two polymer components having mutually different etching resistances, the self-organizing block-copolymer layer furthermore comprising a copolymer pattern structure formed by micro-phase separation of the at least two polymer components, etching selectively a first polymer component of the self-organizing block-copolymer layer, thereby remaining a second polymer component, applying a plasma etching to the neutral layer using the second polymer component as a mask, wherein the plasma etching applied to the neutral layer comprises an inert gas and $H_2$, e.g. $Ar/H_2$.

In example embodiments, the self-organizing block-copolymer layer may be overlying and in contact with a pre-mask pattern and a planarizing neutral layer (NUL). Throughout the description neutral layer and planarizing neutral layer are used to designate the same. In example embodiments, the neutral layer is a layer of material deposited on a substrate and therefore positioned in between the substrate and the self-organizing block-copolymer layer. When a pre-mask pattern (e.g. having ridges and valleys) is present on the substrate, the neutral layer may fill in the valleys and planarize the pre-mask pattern so that a flat platform is offered for the growth of the self-organizing block-copolymer. The top surface of this flat platform may be composed of the top surface of the pre-mask pattern and surrounding neutral layer areas. The top surface of the pre-mask pattern allows an improved self organisation of the self-organizing block-copolymer. The planarizing neutral layer may be of any nature as long as it allows the self-organizing of the block-copolymer layer.

Example embodiments will be described below. The self-organizing block-copolymer layer comprises at least two polymer components having mutually different etching resistances. The self-organizing block-copolymer layer furthermore comprises a copolymer pattern structure formed by micro-phase separation of the at least two polymer components. The method comprises applying an etching process, e.g. a plasma etching process, in order to selectively remove a first polymer phase.

Referring to FIG. 1, an exemplary method 10 for block-copolymer lithography, e.g. for etching a substrate having a block-copolymer layer on a pre-mask pattern and a planarizing neutral layer provided thereon, according to embodiments of the present disclosure is shown. Such method may be useful in the field of integrated circuits, for example as a means to reduce transistor size and spacing and/or to correct defects in small-size features. Thus, features smaller than 100 nm, e.g. features smaller than 50 nm, for example features of smaller than 20 nm, e.g. features smaller than 16 nm, or features of 14 nm, or smaller than 10 nm, for example 5 nm, may be achieved in integrated circuits by application of a method according to embodiments of the present disclosure.

This method 10 comprises the step of obtaining 12 a self-organizing block-copolymer layer on a substrate comprising a pre-mask pattern and a planarizing neutral layer overlying the substrate. In example embodiments, the substrate may be a semiconductor substrate. The semiconductor substrate can, for example, be a silicon substrate or a silicon dioxide substrate. This substrate may also be a layered structure, e.g. a silicon-insulator-silicon structure, and/or may have structures provided therein by previous processing steps. Alternatively, the substrate can be made of or may comprise an upper layer made of a hard mask material such as silicon nitride, silicon oxynitride, silicon dioxide or silicon oxycarbide, spin on glass (SOG/SOC) or combinations thereof.

The self-organizing block-copolymer layer comprises at least two polymer components having mutually different etching resistances. For example, a polymeric composition comprising or consisting of two or more chemically different homopolymer blocks connected by covalent bonds at their chain ends may be coated onto the substrate, e.g. by brushing, rolling, spraying, inkjet application or spin-coating. The polymeric composition may furthermore comprise additives, e.g. adhesives, adhesion promoters and/or solvents. For example, the self-organizing block-copolymer layer may be formed from a di-block copolymer composition comprising two types of polymer chains covalently bonded to each other. For example, such di-block copolymer may comprise polystyrene-polyisobutene, polystyrene-isoprene, polydimethylsiloxane-polyisobutene, polystyrene-polyethylene oxide, polystyrene-polypropylene oxide, polyethyleneoxide-poly(cyanobiphenyloxy)hexyl methacrylate, polystyrene-polymethacrylic acid, polyethylene oxide-polyvinylpyridine, polystyrene-polyvinylpyridine, or polyisoprene-polyhydroxystyrene. Such di-block copolymer may comprise polystyrene (PS) chains covalently bonded to polymethyl methacrylate (PMMA) chains, in which the polystyrene and PMMA have an advantageous etch resistance ratio for dry etching with argon plasma. Alternatively, the self-organizing block-copolymer layer may be formed from a tri-block copolymer composition, for example in which two types of polymer chains A,B are bonded in an A-B-A form or in which three types of polymer chains A,B,C are bonded in an A-B-C form. In an embodiment, one of said polymer component (e.g. said second polymer component) may be polystyrene. This is advantageous because the plasma etching method of the neutral layer according to the present disclosure is surprisingly not etching polystyrene much (and/or not deforming polystyrene structures much upon etching) while it has good etching abilities for other components such as e.g. PMMA, which is notoriously hard to etch. This permits to selectively etch one component without etching much or deforming a second component, which may remain to form a well-defined mask.

In an embodiment, one of said polymer component (e.g. said first polymer component) may be PMMA.

The self-organizing block-copolymer layer furthermore has a copolymer pattern structure formed by micro-phase separation of the at least two polymer components. For example, the polymeric composition coated onto the substrate may be annealed, e.g. at a temperature higher than the glass-transition or melting temperature, during which the components of the polymeric composition may self-assemble into structured domains, thus forming the copolymer pattern structure. For example, thermal annealing may be used at a temperature above the lowest value of the glass transition or melting temperature of at least one polymeric component of the composition. Annealing time may be selected to allow self-assembly, and may be in the range of 0.01 hours to 300 hours. In an example, the range is between 0.1 hours and 24 hours. Prior to the annealing, a pre-bake may be performed in order to remove any residual solvent after block-copolymer deposition (e.g. by spin-casting). In the case of a PS-PMMA block co-polymer, this pre-bake may for instance be performed at a temperature within the range 70° C.-130° C. (e.g. 100° C.) for 30-120 seconds (e.g. 60 seconds). It is advantageous to choose pre-bake conditions that lead to a uniform film across the substrate. In the case of a PS-PMMA block co-polymer, the actual annealing of the block-copolymer may for instance be performed at a temperature of from 200 Celsius (° C.)-300° C. (e.g. 250° C.) for a time span of from 100 to 500 seconds (e.g. 300 seconds) in an oven under inert (e.g. $N_2$) atmosphere.

By selecting an appropriate total chain length and molecular weight of each block in the block-copolymer, e.g. selecting an appropriate Flory Huggins parameter, as known in the art, the morphology of this copolymer pattern structure may be tuned, e.g. in order to create lamellae, cylinders or spheres in the block-copolymer layer. The molecular weight of the block-copolymer may be, for example, selected such that the end-to-end distance of the blocks is commensurate with the smallest feature of the intended pattern. Example molecular weights may range, for example, from 200 to 1000000 g/mol, e.g. from 2000 to 100000 g/mol. Other examples are possible as well.

Figure 2:
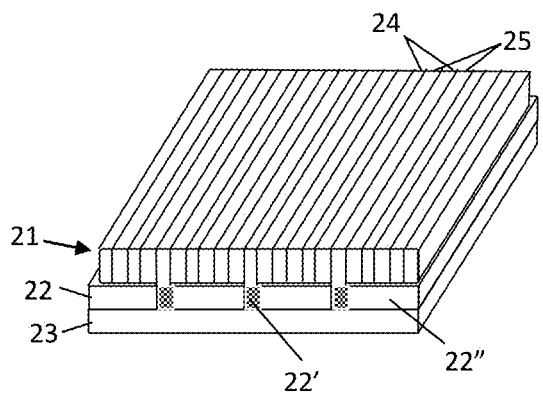
FIG. 2 schematically shows an example self-assembled di-block copolymer layer on a neutral layer for use in a method according to embodiments of the present disclosure.

Referring to FIG. 1 and FIG. 2. In example embodiments according to the present disclosure, the method 10 comprises providing 18 a pre-mask pattern 22' and a planarizing neutral layer 22" on the substrate 23. Such pre-mask pattern 22' may comprise a plurality of guides for aligning the copolymer pattern structure. This plurality of guides may be formed by local differences in a physical or chemical property, e.g. local differences in hydrophilicity. The pre-mask may be created by methods as known in the art. For example, graphoepitaxy methods may be used to inscribe a relief structure on the substrate, such that the low spatial frequency pattern thus formed may be used to constrain and align the high spatial frequency block copolymer pattern. Similarly, chemo-epitaxy methods may be used to provide a pattern on the substrate in which local differences of chemical properties, e.g. hydrophilicity, induce a preferential alignment of a polymer component in the BCP along these patterns. Thus, the alignment of the copolymer pattern structure may be based on preferential attraction of one phase component to the pre-mask pattern, e.g. based on different chemical properties of the phase components, such as a difference in hydrophilicity/hydrophobicity. Thus, a replication of the pre-mask pattern may be obtained in the copolymer pattern structure, e.g. a spatial frequency multiplication of the pre-mask pattern in the vicinity of the substrate. Optionally, the top part of the block-copolymer layer, e.g. starting from the side removed (e.g. remote or distant) from the substrate, may be removed, for example by a uniform, e.g. a selective, etching, cutting or grinding step, in order to remove the region in which this pattern replication may deviate from the pre-mask. For example, FIG. 2 illustrates a block-copolymer layer 21 after annealing, with a laminar copolymer pattern structure registered to layer 22 provided on a substrate, e.g. the silicon substrate 23. Layer 22 comprises a pre-mask pattern. In addition, layer 22 comprised a neutral layer 22' (NUL).

Embodiments of the disclosure may further comprise forming the pre-mask pattern by applying the same etch chemistry as that applied for etching the NUL etch layer, wherein the etch time is adapted to trim (reduce laterally) the pre-mask pattern structures until the required critical dimension is achieved.

Figure 3:
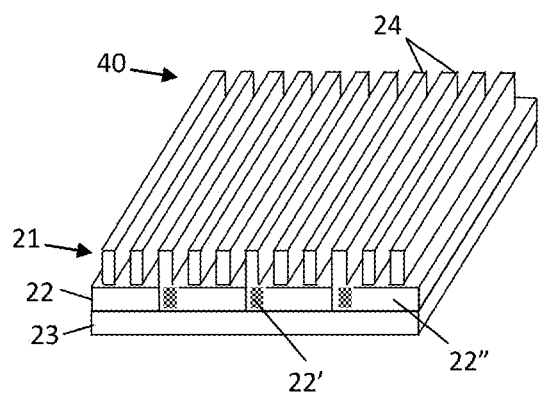
FIG. 3 schematically shows the self-assembled di-block copolymer layer after etching away one polymer component and before etching the neutral layer using a method according to embodiments of the present disclosure.

As shown in the embodiments of FIG. 2 and FIG. 3 the pre-mask pattern 22' may be planarized with a neutral layer 22", i.e. the neutral layer is filling the trenches (gaps) between the two neighbouring pre-mask pattern lines/structures resulting in a planarized (flat) upper underlying the block-copolymer layer 21. Thereby the structures of the pre-mask pattern 22' are embedded in the neutral layer 22" and form altogether layer 22.

Methods for creating the pre-mask 22' are known by the person skilled in the art and may for example be created as described in "Comparison of Directed Self-Assembly Integrations" by Somervell et al. published at SPIE Advanced Lithography, February 2012. Other examples are possible as well. By way of illustration, pre-mask pattern 22' and neutral layer 22" are shown in FIG. 2 and FIG. 3. For example, the block-polymer layer 21 may comprise alternating block domains of a first polymer component, e.g. PMMA 25 and a second polymer component, e.g. polystyrene 24. FIG. 3 illustrates the block polymer layer 21 after etching away the first polymer component, e.g. PMMA 25.

In example embodiments, the neutral layer may be a random copolymer comprising monomers constitutive of each component of the block-copolymer. This is advantageous as it favours chemical compatibility between the neutral layer and the random copolymer. In example embodiments, the neutral layer may be a random copolymer comprising monomers constitutive of the first component of the block co-polymer and monomers constitutive of the second component of the block co-polymer. In example embodiments, the neutral layer may carry hydrophilic moieties such as e.g. hydroxyl moieties. This is advantageous as it facilitates the self-assembly of the block copolymer on the neutral layer. In example embodiments of the disclosure the neutral layer may comprise a mixture of about 50% polystyrene and about 50% PMMA.

In specific embodiments the neutral layer is a hydroxyl-terminated poly(styrene-random-methyl methacrylate) brush ((PS-r-MMA)-OH). The composition of the neutral layer enables the block-copolymer to self-assemble during the annealing process. This (PS-r-MMA)-OH is particularly advantageous when used with a block-copolymer comprising polystyrene and polymethylmethacrylate blocks.

The method 10 further comprises performing an etching, e.g. a plasma etching 14 of the self-organizing block-copolymer layer using single plasma etch step with an ashing gas or a sequence of plasma etching steps in order to selectively remove a first polymer phase. Said sequence of plasma etching steps may comprise a plasma etching step with plasma formed from an ashing gas followed or preceded by a plasma etching/sputtering step with plasma formed from a substantially pure inert gas.

Such an ashing gas may be any suitable ashing gas. One example of an ashing gas that can be used is oxygen. In some embodiments, in order to prevent ashing to occur too fast, the ashing gas may be present in a concentration less than 50%, advantageously less than 20%, still more advantageously less than 10%. Substantially pure refers to a gas mixture comprising only negligible amounts of impurities, and should be interpreted as preferentially pure, although such mixture may contain traces of other elements or molecules in such small amounts as are known not to influence plasma etching in a significant manner. Inert gas refers to a gas which does not, or does only in negligible degree, undergo chemical reactions with the block-copolymer material and its constituents. For example, noble gases and nitrogen may not react or only react weakly with organic compounds.

The inert gas plasma etching may comprise a sputtering step. For example, an argon (Ar) plasma may be used to selectively remove material corresponding to one polymer component, e.g. PMMA, while leaving the copolymer pattern structure formed in the other polymer component, e.g. polystyrene, in place. If the copolymer comprises more than two components, the etch resistance to etching with this inert gas may differ for these components such that three-dimensional structures may be formed by etching, e.g. substantially etching away a first component, etching away a second component to a lesser degree, and leaving a third component even less affected.

In example embodiments, the selectivity of the etching 14 for a first polymer component versus a second polymer component may be eight or higher.

For example, for a polystyrene-block-poly(methylmethacrylate) layer (PS-b-PMMA), the argon plasma may remove the PMMA with minimum erosion of the polystyrene pattern structure. For example, a dry etching step with argon plasma, without bias or low bias, may achieve a PMMA versus PS selectivity of, for example, 8 or higher.

It is an advantage of at least some embodiments of the present disclosure that the ashing gas plasma etching may remove etch residue from the inert gas etching/sputtering step, e.g. in a PS-b-PMMA layer, non-volatile PMMA etch residue which was sputtered or re-deposited on the polystyrene may be converted by the oxygen etching step into volatile material and subsequently efficiently removed.

In example embodiments according to the present disclosure, the method 10 comprises the step 16 of etching the neutral layer using the remaining polymer phase as a mask.

In example embodiments of the disclosure the neutral layer is etched by using a plasma etching comprising an inert gas and $H_2$, thereby obtaining a good pattern transfer from polystyrene (remaining polymer phase acting as a mask) into the neutral layer. In an example, $Ar/H_2$ plasma is used.

The inert gas/$H_2$ (e.g. $Ar/H_2$) plasma etching may be performed with low plasma density such that the polystyrene is not excessively consumed and/or facetted during the inert gas/$H_2$ (e.g. $Ar/H_2$) plasma exposure. The low density plasma is obtained at a low total pressure in the etch chamber of less than 50 mT. In an example, the low density plasma is obtained at a low total pressure in the etch chamber of preferably less than 10 mT.

When a C-comprising gas (e.g. a polymerizing gas) was added to the $Ar/H_2$ plasma improved control on the edge uniformity was obtained.

In a particular example, wherein $CH_4$ was added to the $Ar/H_2$ plasma, a standard deviation ($3\sigma$) of 1.71 was obtained for a line-width (or critical dimension CD) of 25.68 nm. This represents an improvement in edge uniformity of about 1 order of magnitude with respect to the $3\sigma$ value of 22.3 obtained only with the $Ar/H_2$ plasma without addition of C-comprising gas (e.g. polymerizing gas) for about the same CD values.

The polymerizing gas is a carbon (C) comprising gas. In example embodiments of the disclosure the C-comprising gas can comprise further hydrogen. Examples of such C-comprising gases are hydrocarbons such as $CH_4$, $C_2H_4$, $C_2H_6$, $C_3H_8$ and any mixtures thereof. $CH_4$ is particularly advantageous as it is cheaper and polymerizes less than the other C-comprising gases.

In some embodiments, the C-comprising gas may comprise further hydrogen and a halogen compound. Examples of such C— and halogen comprising gases are $CH_3F$, $CH_2F_2$, $C_2H_2F_4$, $CH_3I$ and any mixtures thereof.

In yet other embodiments the C-comprising gas may comprise further oxygen. Examples of such C— and oxygen comprising gases are COS, $CO_2$ and any mixtures thereof. When the C-comprising gas further comprises oxygen, COS is preferred.

Without wishing to be bound by theory it is believed that the carbon comprising gas protects the remaining polymer phase (which is acting as a mask), thereby preserving the profile of the mask during the neutral layer etch.

In specific embodiments, wherein $CH_4$ has been added to $Ar/H_2$ plasma during the neutral layer etch, the polystyrene profile has been better preserved and thereby the pattern transfer to the neutral layer and the underlying substrate has been substantially improved.

In specific examples, the total pressure in the chamber was about 5 mT to 10 mT, the RF power was about 100 W and the chamber was supplied with about 100 sccm $H_2$, 100 sccm Ar and 5 to 10 sccm $CH_4$. Each time a bias was applied of 50 W to 100 W and the etch time was about 15 seconds for a neutral layer having a thickness of 6 nm to 8 nm.

Figure 4:
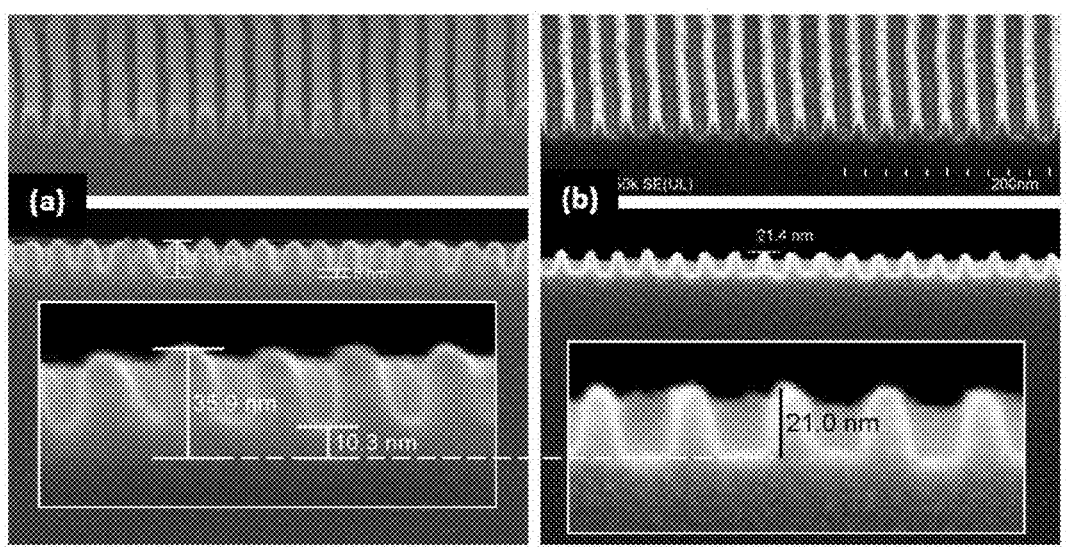
FIG. 4 shows example scanning electron microscope (SEM) cross section pictures showing the transfer of the pattern formed in the di-block copolymer layer into the neutral layer.

FIG. 4 shows SEM cross section pictures after (a) PMMA etch with $Ar/O_2$ and (b) after neutral layer etch with $Ar/H_2$ plasma at low total pressure in the etch chamber. As can be seen the pattern formed in the di-block copolymer layer (picture (a) PS lines with a height of 35.9 nm on top of a neutral layer of about 10.3 nm) is transferred into the neutral layer. Picture (b) shows a total remaining height of 21 nm of PS, which is an indication that some of the polystyrene was consumed during the NUL etch. However the profile is kept and uniformity of the lines is very good.

The method 10 may comprise further forming the pre-mask pattern 22' by applying an inert gas/$H_2$ (e.g. $Ar/H_2$) etch chemistry (e.g. as disclosed in any embodiment above) with the addition of a C-comprising gas. The etch time of the pre-mask pattern is adapted to trim (reduce laterally the line width) the pre-mask pattern structures until the required critical dimension is achieved.

In example embodiments, the pre-mask-pattern may be formed from a cross linked material such as e.g. cross linked polystyrene (X-PS).

In particular examples, the etch time of the layer made of cross linked polystyrene (X-PS) from which the pre-mask pattern 22' is formed is about 60 seconds to 90 seconds depending on the final critical dimensions (CD) which has to be achieved. The X-PS layer is deposited directly on the substrate or on the hard mask layer overlying the substrate.

In a specific example the X-PS layer has a thickness of about 6 nm. When using an etch chemistry consisting of $Ar/H_2/CH_4$ a CD value of 25.68 nm ($3\sigma=1.71$) was obtained for 60 seconds, a CD of 20.52 nm ($3\sigma=2.60$) for 75 seconds, and a CD of 15.42 nm ($3\sigma=6.84$) for 90 seconds. Without wishing to be bound by theory it is believed that the carbon comprising gas interacts with the top part of the remaining polystyrene layer, thereby forming a thin layer which protects the top part if the remaining polystyrene during the trimming process. Consequently, a pre-mask pattern 22' with very narrow lines is obtained while preserving a good control of the profile and the line edge roughness.

In example embodiments according to the present disclosure, the method 10 may further comprises the step of etching the substrate (not shown in FIG. 1) using the remaining polymer component or components, e.g. the pattern formed in polystyrene, after etching away said first polymer component, e.g. the PMMA material, from the block copolymer layer and the remaining neutral layer (under the first polymer component) as a lithographic resist mask.

Alternatively, when a hard mask layer (not shown) is present in between the substrate 23 and the NUL layer 22", the hard mask layer is patterned first and then the pattern is transferred to the substrate.

In a second aspect, the present disclosure relates to an at least partially fabricated integrated circuit such as at least partially fabricated integrated circuit 40, e.g. as shown in FIG. 3, which comprises a polymer pattern structure 24 provided on a substrate 23. This polymer pattern structure is obtained by etching away at least one polymer component 25 of a block-copolymer layer 21 by a method according to the first aspect of the present disclosure. Such a structure typically comprises a block-copolymer layer wherein at least one polymer component 25 has been etched away, said polymer pattern having a half pitch of less than 50 nm, advantageously less than 20 nm, more advantageously less than 16 nm. The NUL layer 22" is further patterned according to the method of the disclosure thereby exposing the substrate or the hard mask layer underneath.

The directed self-assembly samples used for the present example wherein the PMMA & neutral layer etch are optimised, were prepared using chemo-epitaxy flow. A 30-35 nm thick block-copolymer (PS-b-PMMA) film was coated and annealed on top of the neutral layer. Prior to the annealing, a pre-bake was performed in order to remove any residual solvent after spin-casting. This pre-bake was performed at 100° C. for 60 seconds and led to a uniform film across the 300 mm wafer. The actual annealing of the block-copolymer was performed at 250° C. for 300 seconds in an oven under $N_2$ atmosphere.

The neutral layer (6-8 nm) was a mixture of the polystyrene and PMMA. The block-copolymers were self-aligned with the guiding stripes of cross-linked polystyrene (PS) on top of a silicon nitride substrate. After annealing, the block-copolymer formed 14 nm half-pitch lamellar PMMA/PS line/space structures.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims, along with the full scope of equivalents to which such claims are entitled. It is also to be understood that the terminology used herein is for the purpose of describing particular embodiments only, and is not intended to be limiting.

The invention claimed is:

1. A method for block-copolymer lithography, the method comprising:
    forming, a pre-mask layer on a substrate, a pre-mask pattern that includes a plurality of ridges and valleys, wherein the pre-mask layer and the substrate are different materials, wherein the plurality of ridges and valleys comprise a plurality of guides for aligning a copolymer pattern structure;
    subsequent to forming the pre-mask pattern, forming a neutral layer on the substrate, wherein the neutral layer fills the valleys of the pre-mask pattern to planarize the pre-mask layer and promote self-organization of a block-copolymer layer;
    forming a self-organizing block-copolymer layer on the planarized pre-mask layer, the self-organizing block-copolymer layer comprising at least two polymer components having mutually different etching resistances, the self-organizing block-copolymer layer further comprising a copolymer pattern structure formed by microphase separation of the at least two polymer components, wherein the neutral layer is a random copolymer comprising monomers constitutive of each of the at least two polymer components;
    etching selectively a first polymer component of the self-organizing block-copolymer layer, thereby remaining a second polymer component; and
    applying a plasma etching to the neutral layer using the second polymer component as a mask, wherein the plasma etching comprises an inert gas and $H_2$.

2. The method of claim 1, wherein the plasma etching applied to the neutral layer comprises $Ar/H_2$.

3. The method of claim 1, wherein the plasma etching applied to the neutral layer further comprises a C-comprising gas.

4. The method of claim 3, wherein the C-comprising gas is selected from the group consisting of $CH_4$, $C_2H_4$, $C_2H_6$, $C_3H_8$, and any mixtures thereof.

5. The method of claim 1, wherein the total pressure in the etch chamber during the plasma etching of the neutral layer is below 50 mT.

6. The method of claim 1, wherein the pre-mask pattern is formed by applying a plasma etching and trimming process with a plasma comprising an inert gas, $H_2$, and a C-comprising gas.

7. The method of claim 1, wherein the pre-mask pattern is formed by applying a plasma etching and trimming process with a plasma comprising $Ar/H_2$ and $CH_4$.

8. The method of claim 1, in which the copolymer pattern structure is formed by annealing the block copolymer layer.

9. The method of claim 1, wherein the second polymer component is polystyrene.

10. The method of claim 1, wherein the block-copolymer comprises a di-block copolymer comprising two types of polymer chains covalently bonded to each other.

11. The method of claim 10, wherein the di-block copolymer comprises polystyrene-polyisobutene, polystyrene-isoprene, polydimethylsiloxane-polyisobutene, polystyrene-polyethylene oxide, polystyrene-polypropylene oxide, polyethyleneoxide-poly(cyanobiphenyloxy)hexyl methacrylate, polystyrene-polymethyl methacrylate, polystyrene-polymethacrylic acid, polyethylene oxide-polyvinylpyridine, polystyrene-polyvinylpyridine, or polyisoprene-polyhydroxystyrene.

12. The method of claim 1, further comprising selectively etching the first polymer component from the block copolymer layer and subsequently etching the substrate using as a resist mask the second polymer component or components that remain after etching the first polymer component.

13. The method of claim 1, wherein a hard mask layer is present between the substrate and the neutral layer.

14. The method of claim 1, wherein etching selectively a first polymer component of the self-organizing block-copolymer layer comprises:
    using a sequence of plasma etching processes in order to selectively remove the first polymer phase, wherein the sequence of plasma etching steps comprises a plasma etching step with plasma formed from an ashing gas followed or preceded by a plasma etching/sputtering step with plasma formed from a substantially pure inert gas.

15. The method of claim 14, wherein the plasma etching step with plasma formed from an ashing gas removes etch residue from the plasma etching/sputtering step.

16. The method of claim 1, wherein the pre-mask layer comprises:
    cross linked polystyrene (X-PS) deposited directly on the substrate, wherein the plurality of ridges and valleys are defined in the X-PS.

17. The method of claim 1, wherein the substrate comprises a semiconductor material, and wherein the pre-mask layer comprises a cross-linked polymer material.

* * * * *